United States Patent
Hornback et al.

(10) Patent No.: US 6,177,305 B1
(45) Date of Patent: Jan. 23, 2001

(54) FABRICATION OF METAL-INSULATOR-METAL CAPACITIVE STRUCTURES

(75) Inventors: Verne C. Hornback; Derryl D. J. Allman; Newell E. Chiesl, all of Colorado Springs, CO (US)

(73) Assignee: LSI Logic Corporation, Milpitas, CA (US)

( * ) Notice: Under 35 U.S.C. 154(b), the term of this patent shall be extended for 0 days.

(21) Appl. No.: 09/213,847

(22) Filed: Dec. 17, 1998

(51) Int. Cl.[7] .................... H01L 21/285; H01L 21/318
(52) U.S. Cl. .................. 438/240; 438/785; 438/396; 438/907
(58) Field of Search ................... 438/239, 241, 438/243, 381, 396, 585, 240, 785, 251, 775, 907; 118/715, 725, 23; 437/60, 52, 47, 48

(56) References Cited

U.S. PATENT DOCUMENTS

| | | | |
|---|---|---|---|
| 5,449,954 | * 9/1995 | Ito | 257/751 |
| 5,480,684 | 1/1996 | Sandhu | 427/531 |
| 5,541,454 | 7/1996 | Inoue et al. | 257/767 |
| 5,661,319 | 8/1997 | Fujii et al. | 257/295 |
| 5,663,088 | 9/1997 | Sandhu et al. | 438/396 |
| 5,672,385 | 9/1997 | Jimba et al. | 427/248.1 |
| 5,717,250 | 2/1998 | Schuele et al. | 257/754 |
| 5,729,054 | 3/1998 | Summerfelt et al. | 257/751 |
| 5,741,721 | * 4/1998 | Stevens | 437/60 |
| 5,895,239 | * 4/1999 | Jeng et al. | 438/239 |
| 5,903,023 | * 5/1999 | Hoshi | 257/300 |
| 5,906,866 | * 5/1999 | Webb | 427/534 |
| 5,964,947 | * 10/1999 | Zhao et al. | 118/715 |
| 6,103,567 | * 8/2000 | Shih | 438/251 |

OTHER PUBLICATIONS

Applied Materials. Products and Services. MDP: Metal Deposition Product Business Group; Internet http://www.appliedmaterials.com/products/mdp/htm (Oct. 27, 1998).

* cited by examiner

Primary Examiner—Mary Wilczewski
Assistant Examiner—David Goodwin

(57) ABSTRACT

Techniques for fabricating metal-insulator-metal (MIM) capacitive structures by chemical vapor deposition (CVD) help avoid the formation of a porous metal oxide film at the interface between the lower electrode and the insulating layer. One method of fabricating an integrated circuit includes depositing a first titanium nitride electrode layer on a wafer by CVD and subsequently depositing an insulating layer on the first electrode. The insulating layer can comprise a material selected from the group consisting of titanium oxide ($TiO_x$), titanium oxynitride ($TiO_xN_y$), titanium oxycarbonitride ($TiO_xN_yC_z$) and silicon oxide ($SiO_x$), and is deposited by CVD without exposing the first titanium nitride electrode to atmosphere. A second titanium nitride electrode layer also is deposited on the insulating layer by CVD. The various layers of the capacitive structure, including the insulating layer, can be deposited in situ in a single CVD chamber.

27 Claims, 3 Drawing Sheets

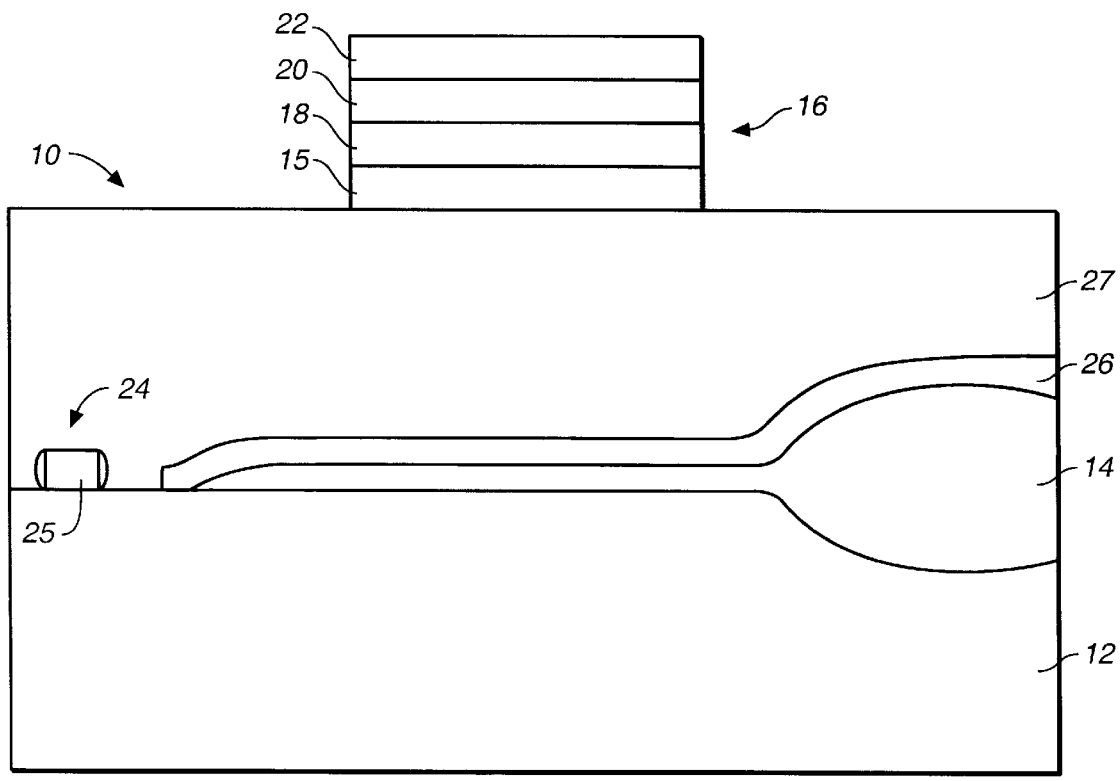
FIG._1
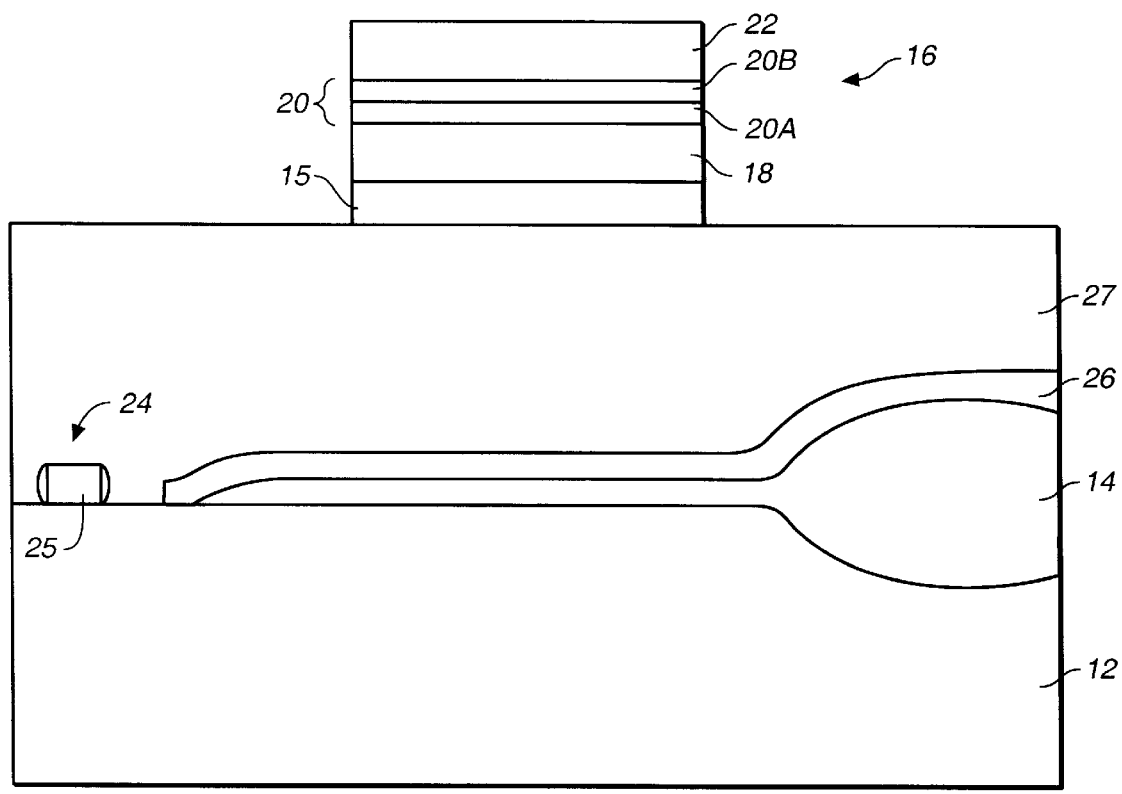
FIG._4

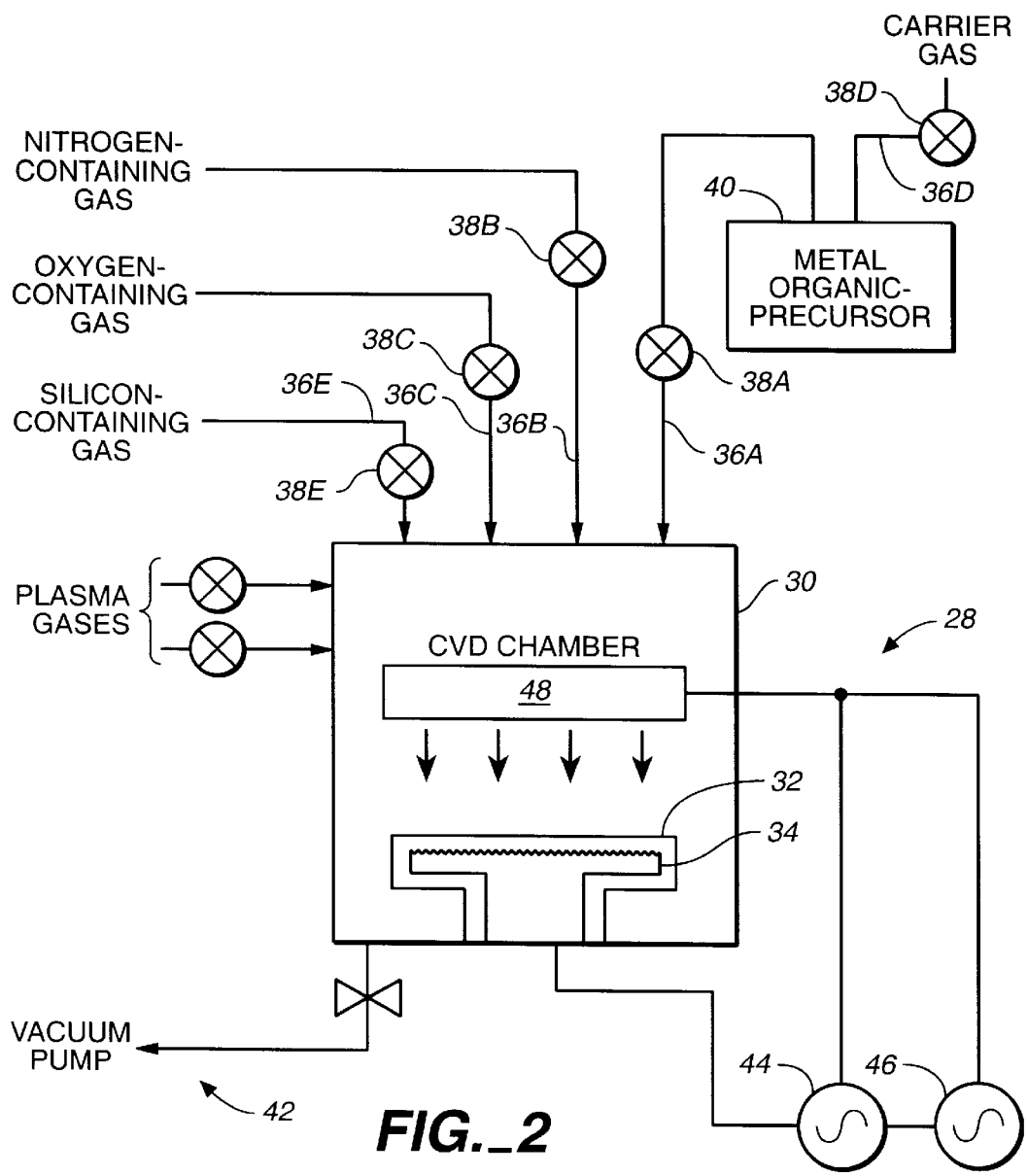
FIG._2
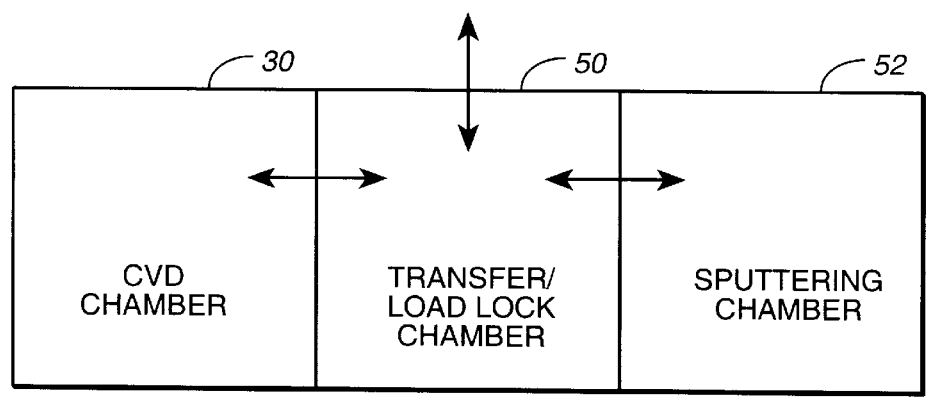
FIG._3

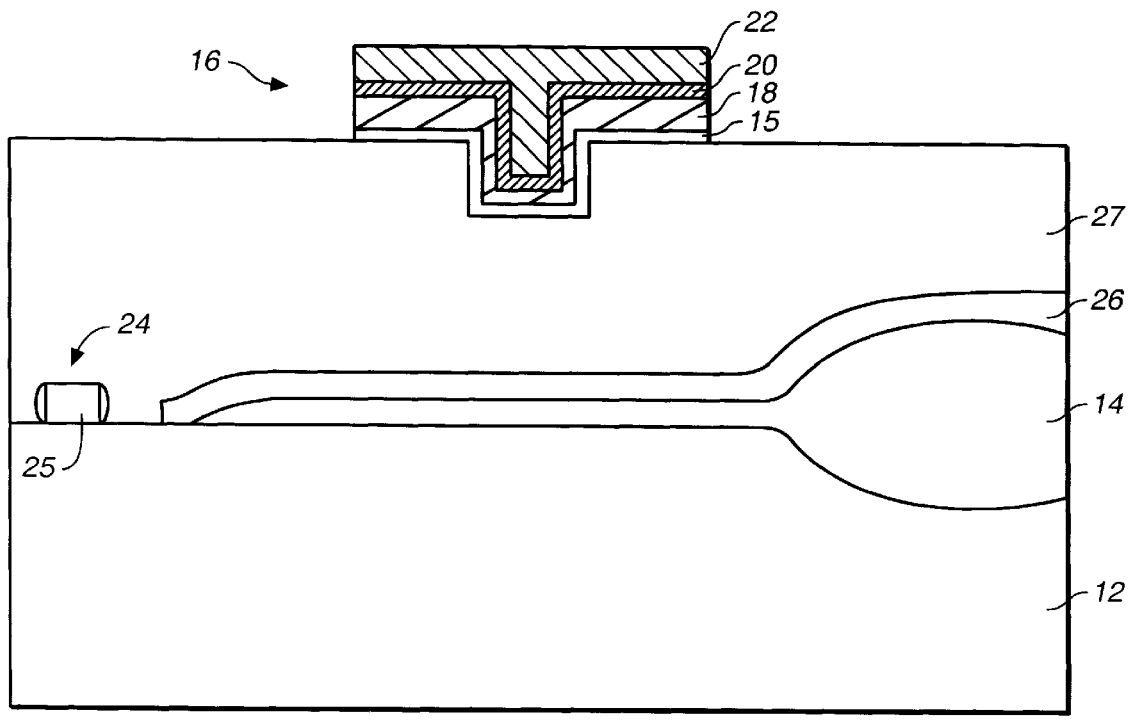
FIG._5
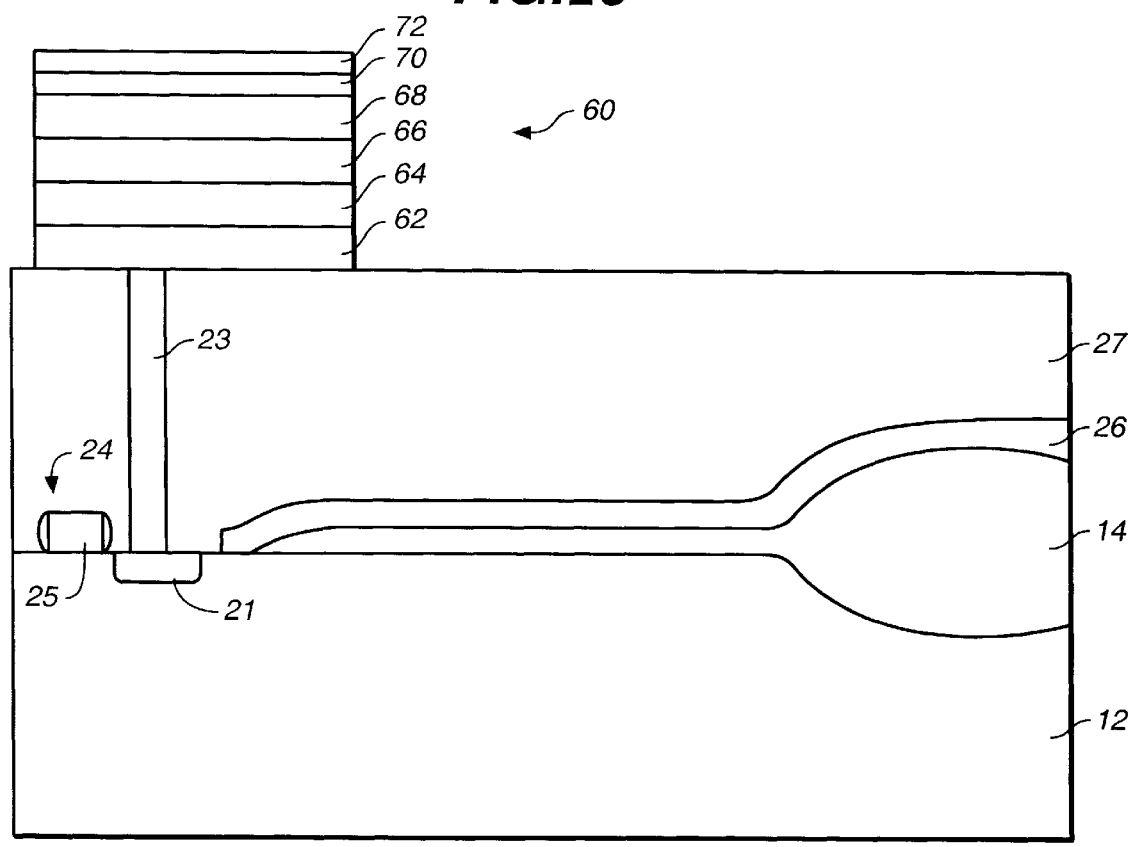
FIG._6

FABRICATION OF METAL-INSULATOR-METAL CAPACITIVE STRUCTURES

BACKGROUND

The present invention relates generally to device fabrication and, in particular, to the fabrication of metal-insulator-metal (MIM) capacitive structures.

Various capacitive structures are used as electronic elements in integrated circuits. Such structures include, for example, metal-oxide-semiconductor (MOS) capacitors, p-n junction capacitors and metal-insulator-metal (MIM) capacitors. For some applications, MIM capacitors can provide certain advantages over MOS and p-n junction capacitors because the frequency characteristics of MOS and p-n junction capacitors may be restricted as a result of depletion layers that form in the semiconductor electrodes. An MIM capacitor can exhibit improved frequency and temperature characteristics. Furthermore, MIM capacitors are formed in the metal interconnect layers, thereby reducing CMOS transistor process integration interactions or complications. Additionally, the topology of the MIM capacitor simplifies planarization processes.

A MIM capacitor includes an insulating layer, such as a dielectric, disposed between lower and upper electrodes. Typically, after formation of the lower MIM capacitor electrode in a first chamber, the wafer is transferred to another chamber or furnace where the insulating layer is deposited. The wafer subsequently is returned to the first chamber or yet a third chamber for deposition of the upper electrode. Titanium nitride (TiN) is sometimes used as the material for the capacitor electrodes.

One difficulty that is encountered during such a fabrication process results from the exposure of the wafer to an ambient containing oxygen when the wafer is transferred from the first chamber to another chamber or furnace for deposition of the insulating layer. As a result of exposure to the oxygen, a thin porous metal oxide film forms on the upper surface of the lower TiN electrode. The presence of the thin porous metal oxide film at the interface between the TiN and insulating layer can allow charge to become fixed or trapped at the interface. Moreover, if the porous metal oxide film is present only at the interface of one electrode, the capacitive structure can exhibit undesired hysteresis affects as the capacitor charges and discharges. Accordingly, improvements in the fabrication of MIM capacitive structures are desirable.

SUMMARY

In general, the invention relates to techniques for fabricating an MIM or similar capacitive structure by chemical vapor deposition (CVD) to help improve the electrical and other properties of the capacitor.

According to one aspect, a method of fabricating a capacitive structure includes depositing a first titanium nitride electrode layer on a wafer by CVD and subsequently depositing an insulating layer on the first electrode by CVD without exposing the first titanium nitride electrode to atmosphere. A second titanium nitride electrode layer then is deposited on the insulating layer by CVD. In some implementations, the insulating layer comprises a material selected from the group consisting of a titanium oxynitride material, a titanium oxycarbonitride material, a titanium oxide material and a silicon oxide material.

According to another aspect, the various layers of the capacitive structure, including the insulating layer, are deposited in situ in a single CVD chamber.

Various embodiments include one or more of the following features. Forming the first and second electrode layers and forming the insulating layer can include providing a gas comprising titanium to an interior of the CVD chamber by heating a metal organic precursor including titanium. Additionally, one or more reactant gases can be provided to the chamber interior to the vicinity of a heated wafer.

The relative amounts of the gases flowing into the chamber interior during formation of the insulating layer can be controlled to establish the stoichiometry of the insulating layer. For example, in some implementations, the insulating layer can comprise a titanium oxide material having the formula $TiO_x$, where x can range from about 1 to about 2. In other embodiments, the insulating layer comprises a titanium oxynitride material having the formula $TiO_xN_y$, where the sum of x and y is equal to about 1, and the value of x is at least as high as about 0.5. Alternatively, the insulating layer can comprise a titanium oxycarbonitride material having the formula $TiO_xN_yC_z$, where the sum of x, y and z is equal to about 1, and the value of x is at least as high as about 0.3. Alternatively, the insulating layer can comprise a silicon oxide material having the formula $SiO_x$ where x can range from about 1 to about 3.

In some embodiments, the relative amounts of the gases flowing into the chamber interior are varied during formation of the insulating to form multiple insulating sub-layers of different stoichiometry. Also, RF generators can be used with one or more gases to densify the metal electrodes or the insulating layer.

In yet another implementation, a method of fabricating a capacitive structure includes forming three electrodes with an insulating layer provided between pairs of electrodes. The lower electrode can be connected electrically to an active region of a transistor, and the middle electrode can serve as a floating electrode. Each of the electrodes and insulating layers can be formed by a CVD process.

Various implementations include one or more of the following advantages. Since the insulating layer is formed without exposing the TiN layer to the atmosphere, formation of a porous metal oxide film at the interface of the lower electrode and the insulating layer can be avoided. Additionally, the foregoing techniques can provide greater control over the stoichiometry and thickness of the insulating layer. The dielectric constant and, therefore, the capacitance, of the resulting insulator can be controlled more precisely to allow better control of the electrical response. Moreover, the CVD process allows the MIM structure to be formed on a flat topology or a more complicated topology.

Furthermore, forming the insulating layer of the MIM structure in situ allows the fabrication process to be performed more quickly, thereby increasing the overall throughput of the fabrication system. Specifically, obviating the need to transfer the wafer among different chamber during formation of the capacitive structure can reduce the overall fabrication time. Additionally, in situ deposition also can reduce defects caused by increased handling of the device, thereby providing higher production yields.

Other features and advantages will be readily apparent from the following detailed description, the accompanying drawings and the claims.

BRIEF DESCRIPTION OF THE DRAWINGS

FIG. 1 illustrates a portion of an exemplary integrated circuit including a capacitive structure formed according to the present invention.

FIG. 2 illustrates an exemplary CVD chamber for use in the present invention.

FIG. 3 is a block diagram showing an exemplary system of processing chambers for use in the present invention.

FIG. 4 illustrates a capacitive element with an insulating layer having multiple sub-layers according to the present invention.

FIG. 5 illustrates another embodiment of a capacitive element which can be formed according to the present invention.

FIG. 6 illustrates another embodiment of a capacitive element which can be formed according to the present invention.

DETAILED DESCRIPTION

As shown in FIG. 1, an exemplary integrated circuit or wafer 10 includes a silicon or other semi-conductor substrate 12. An interlayer dielectric or a field oxide layer 14 is formed on the substrate 12 which may have one or more previously-formed layers including active regions for transistors 24 or other devices. A chemically-mechanically polished insulating layer 27 separates the transistor polysilicon gate 25 and local interconnect layer 26 from other metal interconnect layers. A capacitive element 16 is formed over insulating layer.

The capacitive element 16 includes an insulating dielectric layer 20 disposed between an upper electrode 22 and a lower electrodes 18. The electrodes 18, 22 can be formed of a material including TiN, and the insulating layer 20 can include a titanium oxynitride material having the formula $TiO_xN_y$ or a titanium oxycarbonitride material having the formula $TiO_xN_yC_z$. In the chemical formula $TiO_xN_y$, the sum of x and y is equal to about 1, with the value of x preferably at least as high as about 0.5. Similarly, in the chemical formula $TiO_xN_yC_z$, the sum of x, y and z is equal to about 1, with the value of x preferably at least as high as about 0.3. Alternatively, the insulating layer 20 can include a titanium oxide material having the formula $TiO_x$ where x is in the range of about 1 to 2. In yet another embodiment, the insulating layer 20 includes a silicon oxide material having the formula $SiO_x$ where x is in the range from about 1 to 3. A thin titanium film 15 preferably is disposed between the lower electrode 18 and the insulating layer 27 to improve adhesion of the TiN layer 18.

The capacitive element 16 is formed in a chemical vapor deposition (CVD) apparatus 28 (FIG. 2). In general, CVD is defined as the formation of a non-volatile solid film on a substrate by the reaction of vapor phase reactants that contain desired components. Gases are introduced into a reactor vessel where they decompose and react at a heated surface on a semiconductor wafer to form the desired film. The CVD process is advantageous because it can provide highly conformal layers even within deep contacts and other openings.

The CVD apparatus 28 includes a chamber or reactor 30 which has a wafer support or holder 32 including a heating element 34. The chamber 30 is a vessel which can be vacuum pumped by a vacuum pump system 42. Gas lines or pipes 36A through 36E are provided for introducing a metal organic precursor gas and various carrier and reactant gases to the interior of the reactor 30. Respective valves or flow rate controllers 38A through 38E are associated with the gas lines 36A through 36E for controlling the flow of the gases to the reactor 30. The metal organic precursor is supplied from a container 40, and a bubbler or vaporizer (not shown) is provided for heating the metal organic precursor. An upper electrode 48 also serves as a gas diffuser in the chamber. RF generators 44, 46 are coupled to the upper electrode 48 and the heating element, which can serve as a lower electrode. In one implementation, the RF generator 44 operates at a frequency of about 13.56 megahertz (MHz), whereas the RF generator 46 operates at a frequency in the range of about 2 kilohertz (kHz) to about 500 kHz. The RF generators 44, 46 can be used for generating a plasma and for controlling the directionality of ions in the chamber.

The CVD reactor 30 has a gate valve (not shown) through which a wafer can be transferred to and from the interior of the reactor. The CVD apparatus 28 also can include means (not shown) for controlling and measuring the temperature in the reactor. Such means can include, for example, a heater on the wall of the reactor, a thermo-couple, a power supply coupled to the heater, and a controller to control the amount of power delivered to the heater. The CVD apparatus 28 also can include a diaphragm vacuum gauge (not shown), an ionization vacuum gauge (not shown) for measuring the pressure in the reactor, and cooling lines (not shown) for controlling the temperature of the wafer and the chamber.

In one particular embodiment, a CVD TiN TxZ™ chamber, commercially available from Applied Materials, Inc., is used as the chamber 30. However, the invention is not limited to the use of that CVD chamber and, in any given implementation, may include only some of the features of the exemplary CVD apparatus 28 described above. Additionally, although the CVD apparatus 28 described above has a chamber 30 for processing a single wafer at a time, batch systems, in which multiple wafers are processed simultaneously, also can be used.

Prior to forming the capacitive element 16, a wafer with the chemically-mechanically polished insulating layer 27 previously formed thereon is transferred to a load lock chamber 50 (FIG. 3). The wafer then is transferred from the load lock chamber 50 to a physical sputtering chamber 52 where the titanium film 15 is deposited using known techniques.

Next, the wafer is transferred from the sputtering chamber 52 to the CVD chamber 30 via the load lock chamber 50. The wafer is placed on the holder 32 which is preheated to a temperature in the range of about 300–500 degrees celsius (° C.) to heat the wafer. The chamber 30 is evacuated to a pressure of about 104 Pa.

To form the lower TiN electrode 18, a gas comprising titanium and a reactant gas comprising nitrogen are provided to the chamber interior. A metal organic precursor having the formula $Ti(NR_2)_4$ is heated in the container 40 at about 40° C. and serves as the source of titanium. In the formula $Ti(NR_2)_4$, R can be selected from the group consisting of hydrogen (H) and a carbon-containing radical. In one implementation, the metal organic precursor is $Ti(N(CH_3)_2)_4$, known as tetrakisdimethylamino titanium (TDMAT), in other words, R is $CH_3$. Tetrakisdiethylamino titanium (TDEAT) also is suitable as the metal organic precursor. Alternatively, other sources of titanium, such as titanium tetrachloride ($TiCl_4$), can be used. The RF power supplies 44, 46 can be used with a gas flow comprising a mixture of hydrogen ($H_2$) and nitrogen ($N_2$), silane ($SiH_4$), or a mixture of $SiH_4$ and $N_2$, to help densify the film.

Once the chamber 30 has been evacuated, the valves 38A and 38D are opened to introduce the titanium-containing gas and a carrier gas, such as helium (He), into the chamber. At the same time, the valve 38B is opened to introduce a reactant gas containing nitrogen into the chamber 30. Suitable nitrogen-containing gases include $N_2$, ammonia ($NH_3$), or a mixture of $N_2$ and $H_2$. As the gases are introduced into the chamber 30, they can be heated by the temperature control means (not shown) and are heated in the vicinity of the wafer by the heating member 34 to cause a thermal chemical reaction. In some embodiments, a gaseous plasma is provided to the chamber. As a result, a thin TiN film 18 is formed on the titanium film 15. When the thickness of the TiN film 18 reaches a predetermined level, such as 50 angstroms (A), the valves 38A, 38D are closed to stop the supply of the carrier gas and the gas containing titanium. More generally, in some implementations, the thickness of the TiN layer 18 may be as small as 30 A and as large as 3,000 Å. Gas remaining in the chamber 30 is removed by the vacuum system 42.

The pressure in the chamber 30 during the deposition of the TiN film 18 is in the range of approximately ten milliTorr (mTorr). The pressure is controlled by adjusting the flow rates of the titanium-containing gas, the carrier gas and the nitrogen-containing gas, as well as a throttle valve.

If the metal organic precursor used for deposition of the TiN film 18 includes carbon, a plasma treatment using a mixture of $H_2$ and $N_2$ gases can be performed to reduce the carbon content of the TiN film. During the plasma treatment, hydrogen radicals react with carbon in the TiN film to produce gaseous products which diffuse outwardly from the wafer and which subsequently are removed from the chamber 30. The addition of the $N_2$ gas during the plasma treatment further enhances the nitrogen content of the TiN film 18.

Following deposition of the TiN film 18 and the plasma treatment (if any), the insulating layer 20 of $TiO_xN_y$, $TiO_x$-$N_yC_z$ or $TiO_x$ is formed by opening the valves 38A, 38D to introduce the carrier gas and the metal organic precursor gas into the chamber 30 and by opening the valves 38B, 38C to introduce the nitrogen and oxygen reactants gases into the chamber 30. Alternatively, an insulating layer 20 of $SiO_x$ can be formed by opening the valves 38C and 38E to introduce silicon and oxygen reactant gases into the chamber 30. A plasma process can be used to form the $SiO_x$ film on the surface of the wafer.

In various implementations, the oxygen-containing gas which flows through the line 36C comprises, for example, oxygen ($O_2$), carbon monoxide (CO), carbon dioxide ($CO_2$), nitric oxide (NO), nitrous oxide ($N_2O$) or a mixture of those gases. Similarly, the gas flowing through the line 36E can comprise, for example, $SiH_4$. The temperature and pressure in the chamber 30 and the temperature of the wafer during formation of the insulating layer 20 can be adjusted to be about the same as during the deposition of the TiN film 18. Exemplary temperature and pressure ranges are about 300° C. to about 500° C. and about 7 mTorr to about 1,000 mTorr, respectively.

When the thickness of the insulating layer 20 reaches a predetermined level, the valves 38A through 38E are closed to stop the supply of the various gases. Exemplary values of the thickness of the insulating layer 20 range from about 25 Å to about 2,000 Å. The particular thickness depends on the desired capacitance of the capacitive element 16 because the capacitance is directly proportional to the dielectric constant E and indirectly proportional to the thickness of the insulating layer 20. Gas remaining in the chamber 30 is removed by the vacuum system 42.

Depending on the chemical composition of the metal organic precursor as well as the oxygen and nitrogen gases used during deposition of the insulating layer 20, the flow rates of the gases can be controlled to form $TiO_x$, $TiO_xN_y$ or $TiO_xN_yC_z$. The values of x, y and z, can be selected by adjusting the valves 38A through 38D to control the relative flow rates of the various gases into the chamber 30. The relative amounts of titanium, oxygen, nitrogen and carbon determine the dielectric constant E of the insulating layer 20, which, in some implementations, can range from about 3 to about 15. Similarly, when forming an insulating layer 20 of $SiO_x$, the value of x can be selected by adjusting the valves 38C and 38E to control the relative flow rates of the various gases into the chamber 30. For some analog mixed signal applications such as a tuner, a capacitance of about one to five femto-farads per square micron is suitable.

In some implementations, a plasma treatment of $O_2$ gas or a mixture of $O_2$ and $N_2$ gases can be performed after deposition of the insulating layer 20. Helium gas also can be added during the plasma treatment to improve the plasma ionization efficiency. The plasma treatment helps densify the insulating layer 20 and, in some cases, can be used to modify the stoichiometry of the film.

As described above, the insulating layer 20 can consist of a single deposited layer of a $TiO_x$, $TiO_xN_y$, $TiO_xN_yC_z$ or $SiO_x$. Alternatively, the insulating layer 20 can comprise two or more sub-layers 20A, 20B (FIG. 4) formed in the CVD chamber 30. Each sub-layer 20A, 20B is formed as described above with respect to the insulating layer 30. However, the particular stoichiometry of each sub-layer 20A, 20B can differ by varying the relative amounts of the gases flowing through the lines 36A through 36E when each such sub-layer is formed. After deposition of each sub-layer 20A, 20B, the valves 38A through 38E are closed to stop the supply of the various gases to the chamber 30, and any gas remaining in the chamber 30 is removed by the vacuum system 42. A plasma treatment also can be performed after deposition of each sub-layer 20A, 20B. Thus, the insulating layer 30 can have a graded composition which is tailored to the particular requirements of the device being fabricated.

Following deposition of the insulating layer 20, another TiN film is deposited to form the upper electrode 22. The TiN film forming the upper electrode 22 also is deposited in the CVD chamber 30 and can be deposited using the same technique used for forming the lower electrode 18.

As before, a plasma treatment using a mixture of $H_2$ and $N_2$ gases can be performed following deposition of the TiN film. The thickness of the upper electrode 22 can range, for example, from about 20 Å to about 3,000 Å.

The wafer then is removed from the CVD chamber 30 and transferred to the load lock chamber 50. Further processing can be performed in other chambers or furnaces to complete the integrated circuit 10.

FIG. 6 illustrates another capacitive structure 60 which can be formed in the CVD chamber 30. The capacitive structure 60 includes a floating electrode 68 between upper and lower electrode 64, 72 with insulating layers 66, 70 provided between each pair of electrodes. The lower electrode 64 is connected electrically to an active region 21 of the transistor 24 by a tungsten (W) or other conductive plug 23. A thin Ti film 62 can be provided between the lower electrode 64 and the tungsten plug to improve adhesion of the lower electrode.

The electrodes 64, 68, 72 can be made of titanium nitride using the same techniques as described above with respect to the TiN electrodes 18, 22. Similarly, the insulating layers 66, 70 can be made of $TiO_x$, $TiO_xN_y$, $TiO_xN_yC_z$ or $SiO_x$ using the same techniques as described above with respect to the insulating layer 20. All layers 64, 66, 68, 70 and 72 of the capacitive structure 60 can be formed in the single CVD chamber 30.

The invention allows the insulating layer 20 to be formed on the lower TiN electrode without exposing the TiN layer to the atmosphere. Therefore, formation of a porous metal oxide film at the interface of the lower electrode and the insulating layer can be avoided. Additionally, the foregoing techniques can provide greater control over the stoichiometry of the insulating layer. The dielectric constant and, therefore, the capacitance, of the resulting insulator can be controlled more precisely. Moreover, the CVD process allows the MIM structure to be formed on a flat topology (FIG. 1) or a more complicated topology, such as a trench etched into the insulating layer 27 (FIG. 5). Furthermore, the CVD process can result in a reduced defect density and allows thinner films to be formed, thereby reducing the overall topology of the wafer.

According to the foregoing techniques, the MIM capacitive structure, including the insulating layer 20, is fabricated in situ in a single CVD chamber. Fabricating the insulating layer 20 of the MIM structure in situ allows the fabrication process to be performed cleanly, quickly and more precisely, thereby increasing the throughput of the integrated circuit and reducing the cost of the integrated process fabrication system. In particular, obviating the need to transfer the wafer among different chamber during formation of the capacitive structure can reduce the overall fabrication time. Nevertheless, in some implementations, the layers 28, 20, 22 of the capacitive structure 16, as well as the layers 64, 66, 68, 70 and 72 of the capacitive structure 60, can be formed in different CVD chambers so long as the wafer is transferred between the various chambers under vacuum, in other words, without exposing the interfaces between the insulating layers and the electrodes to the atmosphere.

Other implementations are within the scope of the following claims.

What is claimed is:

1. A method of fabricating a capacitive structure, the method comprising:

forming a first electrode layer comprising titanium nitride on a wafer, wherein the first electrode is formed in a chemical vapor deposition chamber;

forming an insulating layer on the first electrode layer in the CVD chamber wherein the insulating layer comprises a material selected from the group consisting of titanium oxynitride and titanium oxycarbonitride; and forming a second electrode layer comprising titanium nitride on the insulating layer, wherein the second electrode layer is formed in the CVD chamber.

2. The method of claim 1 wherein forming the first and second electrode layers and forming the insulating layer includes providing a gas comprising titanium to an interior of the chamber.

3. The method of claim 2 wherein providing a gas comprising titanium includes heating a metal organic precursor including titanium.

4. The method of claim 2 wherein forming the first and second electrode layers and forming the insulating layer further includes:

providing one or more reactant gases to the chamber interior; and heating the gas comprising titanium and the one or more reactant gases in a vicinity of the wafer.

5. The method of claim 4 wherein forming the insulating layer further includes providing a gas comprising oxygen to the chamber interior.

6. The method of claim 5 wherein forming the insulating layer further includes providing a gas comprising nitrogen to the chamber interior.

7. The method of claim 6 wherein forming the insulating layer further includes providing a gas comprising carbon to the chamber interior.

8. The method of any one of claims 5, 6 and 7 further including controlling relative amounts of the gases flowing into the chamber interior during formation of the insulating layer to control the stoichiometry of the insulating layer.

9. The method of claim 8 wherein the insulating layer comprises a titanium oxide material having the formula $TiO_x$, wherein the value of x is in a range of about 1 to about 2.

10. The method of claim 8 wherein the insulating layer comprises a titanium oxynitride material having the formula $TiO_xN_y$, wherein the sum of x and y is equal to about 1, and the value of x is at least as high as about 0.5.

11. The method of claim 8 wherein the insulating layer comprises a titanium oxycarbonitride material having the formula $TiO_xN_yC_z$, wherein the sum of x, y and z is equal to about 1, and the value of x is about 0.3 or higher.

12. The method of claim 8 further including varying the relative amounts of the gases flowing into the chamber interior during formation of the insulating layer to form multiple insulating sub-layers of different stoichiometry.

13. The method of claim 4 further including:

performing a plasma treatment with respect to at least one of the first electrode, the second electrode, and the insulating layer.

14. The method of claim 4 further including:

removing gases remaining in the chamber after formation of the first electrode and prior to formation of the insulating layer; and removing gases remaining in the chamber after formation of the insulating layer and prior to formation of the second electrode.

15. A method of fabricating a capacitive structure, the method comprising:

forming a first titanium nitride electrode electrically connected to an active region formed on a semiconductor wafer, wherein the first electrode is formed using a chemical vapor deposition (CVD) process;

forming a first insulating layer on the first nitride electrode by a CVD process without exposing the first electrode to atmosphere;

forming a second titanium nitride electrode on the first insulating layer using a CVD process;

forming a second insulating layer on the second electrode using a CVD process; and forming a third electrode on the second insulating layer using a CVD process.

16. The method of claim 15 wherein the acts of forming are performed in a single CVD chamber.

17. The method of claim 15 wherein each of the acts of forming the first and second insulating layers includes forming a material selected from the group consisting of titanium oxide, titanium oxynitride and titanium oxycarbonitride.

18. The method of claim 15 wherein each of the acts of forming the first and second insulating layers includes forming a silicon oxide material.

19. The method of claim 15 wherein forming the second insulating layer includes forming the second insulating layer on the second nitride electrode without exposing the second electrode to atmosphere.

20. The method of claim 16 wherein forming the insulating layers further includes:

providing a reactant gas comprising silicon and oxygen to the chamber; and heating the gas in a vicinity of the wafer.

21. The method of claim 20 wherein forming the insulating layers includes providing a silane gas to the chamber.

22. The method of claim 15 wherein the insulating layers comprise a silicon oxide material having the formula $SiO_x$, wherein the value of x is in a range of about 1 to about 3.

23. The method of claim 15 further including varying the relative amounts of one or more gases flowing into the chamber interior during formation of the insulating layer to form multiple insulating sub-layers of different stoichiometry.

24. The method of claim 15 wherein forming the first insulating layer includes forming a material selected from the group consisting of titanium oxide, titanium oxynitride and titanium oxycarbonitride.

25. The method of claim 15 wherein forming the first insulating layer includes forming a silicon oxide material.

26. The method of claim 15 wherein forming the second insulating layer includes forming a material selected from the group consisting of titanium oxide, titanium oxynitride and titanium oxycarbonitride.

27. The method of claim 15 wherein forming the second insulating layer includes forming a silicon oxide material.

* * * * *